(12) United States Patent
Wang

(10) Patent No.: US 10,291,156 B2
(45) Date of Patent: May 14, 2019

(54) COMBINED HYBRID THERMIONIC AND THERMOELECTRIC GENERATOR

(71) Applicant: GE Aviation Systems LLC, Grand Rapids, MI (US)

(72) Inventor: John Xiaozhong Wang, Grand Rapids, MI (US)

(73) Assignee: GE Aviation Systems LLC, Grand Rapids, MI (US)

( * ) Notice: Subject to any disclaimer, the term of this patent is extended or adjusted under 35 U.S.C. 154(b) by 806 days.

(21) Appl. No.: 14/927,841

(22) Filed: Oct. 30, 2015

(65) Prior Publication Data
US 2017/0126150 A1 May 4, 2017

(51) Int. Cl.
*H02N 3/00* (2006.01)
*B64C 39/02* (2006.01)
(Continued)

(52) U.S. Cl.
CPC .............. *H02N 3/00* (2013.01); *B64C 39/024* (2013.01); *B64D 15/12* (2013.01); *B64D 33/04* (2013.01);
(Continued)

(58) Field of Classification Search
CPC ...... B64C 39/024; B64D 33/04; B64D 41/00; B64D 2033/045; B64D 2221/00; H02N 3/00; H01L 135/30
(Continued)

(56) References Cited

U.S. PATENT DOCUMENTS 3,437,847 A * 4/1969 Raspet .................... H01J 45/00
136/202
4,368,416 A * 1/1983 James ...................... H02N 3/00
136/205
(Continued)

FOREIGN PATENT DOCUMENTS

CN 100593281 C 3/2010
EP 1746257 A2 1/2007
(Continued)

OTHER PUBLICATIONS

Xuan et al., "Optimization of a Combined Thermionic-Thermoelectric Generator," Journal of Power Sources 115 (2003), pp. 167-170—Abstract Only.
(Continued)

*Primary Examiner* — Forrest M Phillips
(74) *Attorney, Agent, or Firm* — GE Aviation Systems LLC; William Andes

(57) ABSTRACT

Systems and methods for power generation for an aircraft are provided. In one example embodiment, a power generation system for an aircraft includes a thermionic generator arranged to receive heat from at least one heat source. The thermionic generator is configured to generate electrical power for one or more aircraft systems based at least in part on the heat received from the at least one heat source. The power generation system further includes a thermoelectric generator arranged to receive waste heat from the thermionic generator. The thermoelectric generator is configured to generate electrical power for one or more aircraft systems based at least in part on the waste heat received from the thermionic generator.

17 Claims, 3 Drawing Sheets

(51) Int. Cl.
*B64D 15/12* (2006.01)
*B64D 33/04* (2006.01)
*B64D 41/00* (2006.01)
*H01L 35/30* (2006.01)
*H01J 45/00* (2006.01)

(52) U.S. Cl.
CPC .............. *B64D 41/00* (2013.01); *H01J 45/00* (2013.01); *H01L 35/30* (2013.01); *B64D 2033/045* (2013.01); *B64D 2221/00* (2013.01)

(58) Field of Classification Search
USPC ........................................................ 310/306
See application file for complete search history.

(56) References Cited

U.S. PATENT DOCUMENTS

| | | | |
|---|---|---|---|
| 5,492,570 A * | 2/1996 | Horner-Richardson | ..................... F28D 15/02 136/200 |
| 6,034,408 A | 3/2000 | Ghoshal | |
| 6,313,391 B1 | 11/2001 | Abbott | |
| 7,776,295 B2 | 8/2010 | Konigorski | |
| 8,044,292 B2 | 10/2011 | Xiao et al. | |
| 8,310,127 B2 | 11/2012 | Hagg | |
| 8,829,325 B2 | 9/2014 | Zuppero et al. | |
| 9,368,708 B2 * | 6/2016 | Kanno | ..................... H01L 35/16 |
| 2003/0066476 A1 | 4/2003 | Caillat et al. | |
| 2004/0099304 A1 * | 5/2004 | Cox | ..................... B60L 11/00 136/253 |
| 2010/0212712 A1 * | 8/2010 | Tran | ..................... C06C 15/00 136/205 |
| 2016/0156285 A1 * | 6/2016 | Elgezabal Gomez | . B64D 41/00 310/306 |

FOREIGN PATENT DOCUMENTS

| | | |
|---|---|---|
| EP | 2500269 A1 | 9/2012 |
| GB | 2496839 | 5/2013 |
| JP | 2011003620 A | 1/2011 |
| WO | WO2014/033690 | 3/2014 |

OTHER PUBLICATIONS

Wagner et al., A Design to Generate UAV Electrical Power in Flight, EE Times, Jun. 6, 2012, Accessed on Oct. 22, 2015—11 pages.
GB Search Report issued in connection with corresponding GB Application No. 1617867.5 dated Jan. 17, 2017.

* cited by examiner

COMBINED HYBRID THERMIONIC AND THERMOELECTRIC GENERATOR

FIELD OF THE INVENTION

The present subject matter relates generally to electrical power generation systems for aircraft.

BACKGROUND OF THE INVENTION

Generation of electrical power for aircraft systems is often performed by generators that are driven mechanically by engines (e.g., gas turbine engines). These power sources can require aviation fuel to be burned to generate power. The increase in fuel burn can provide extra load on the engine above the requirements for propulsion of the aircraft. Generation of electrical power from power sources that do not require the additional burning of fuel can be desirable for certain aircraft, such as unmanned aerial vehicles.

Thermoelectric generators have been used to generate electrical power for aircraft. Thermoelectric generators are configured to convert heat from a heat source (e.g. solar heat, bleed air, etc.) into electrical power to power aircraft systems.

BRIEF DESCRIPTION OF THE INVENTION

Aspects and advantages of embodiments of the present disclosure will be set forth in part in the following description, or may be learned from the description, or may be learned through practice of the embodiments.

One example aspect of the present disclosure is directed to a power generations system for an aircraft. The power generation system includes a thermionic generator arranged to receive heat from at least one heat source. The thermionic generator can be configured to generate electrical power for one or more aircraft systems based at least in part on the heat received from the at least one heat source. The system further includes a thermoelectric generator arranged to receive waste heat from the thermionic generator. The thermoelectric generator is configured to generate electrical power for one or more aircraft systems based at least in part on the waste heat received from the thermionic generator.

Another example aspect of the present disclosure is directed to a method of generating power for one or more aircraft systems. The method includes receiving heat at a thermionic generator from at least one heat source and generating electrical power with the thermionic generator for one or more aircraft systems based at least in part on the heat received from the at least one heat source. The method further includes receiving waste heat from the thermionic generator at a thermoelectric generator and generating electrical power with the thermoelectric generator for the one or more aircraft systems based at least in part on the waste heat received from the thermionic generator.

Yet another example aspect of the present disclosure is directed to an aircraft. The aircraft can include a heat source and an electrical distribution bus configured to distribute electrical power to one or more aircraft systems. The aircraft can include a thermionic generator arranged to receive heat from the heat source. The thermionic generator can be configured to generate electrical power for one or more aircraft systems based at least in part on the heat received from the at least one heat source. The system further includes a thermoelectric generator arranged to receive waste heat from the thermionic generator. The thermoelectric generator is configured to generate electrical power for one or more aircraft systems based at least in part on the waste heat received from the thermionic generator.

Variations and modifications can be made to these example aspects of the present disclosure.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION OF THE INVENTION

Figure 1:
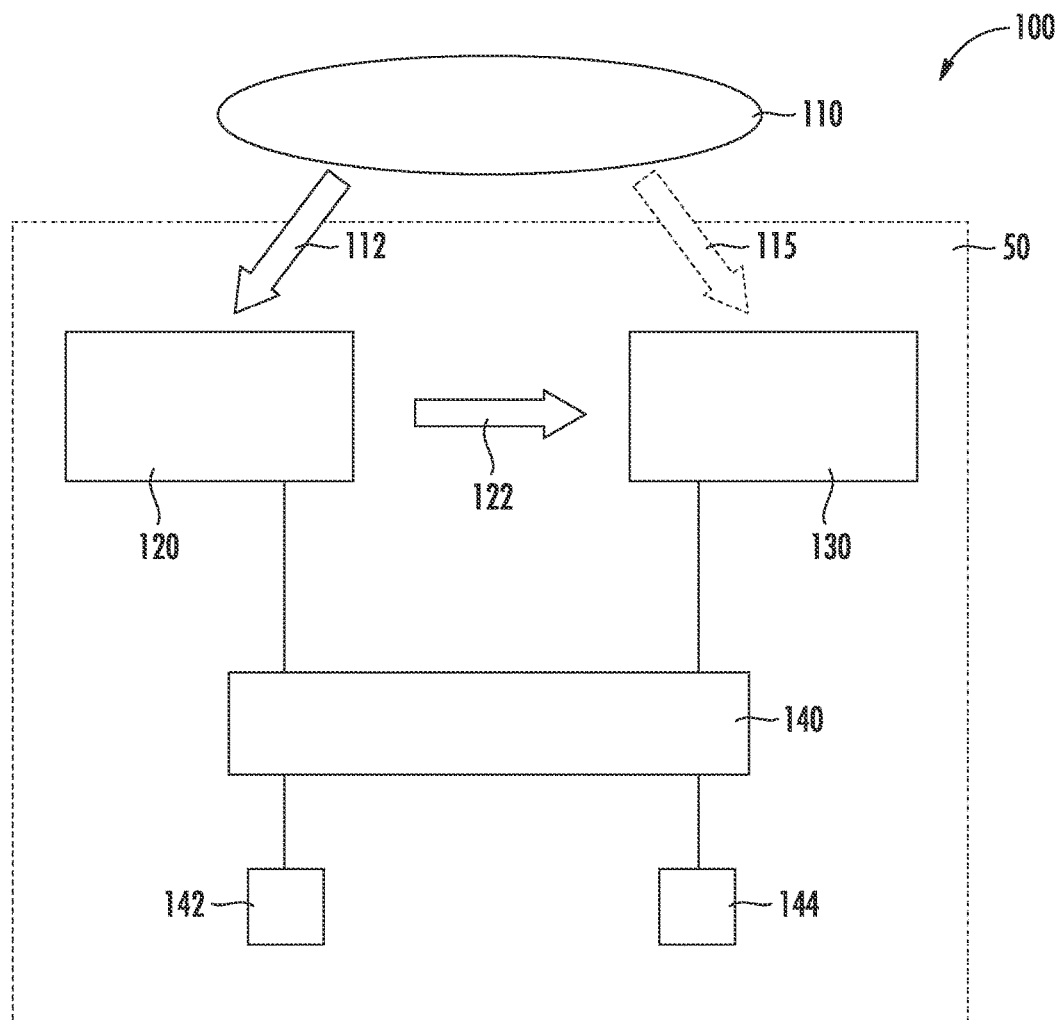
FIG. 1 depicts an overview of an example power system for an aircraft according to example embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to generating electrical power for one or more aircraft systems on an aircraft. More particularly, a power generation system can include a thermionic generator configured to generate electrical power using heat received from a heat source. The power generation system can further include a thermoelectric generator. The thermoelectric generator can receive waste heat that is not converted into electrical energy by the thermionic generator and can use the waste heat to generate additional electrical power for the aircraft.

In this way, the combined thermionic generator and thermoelectric generator can increase power output and efficiency when compared to standard power generation systems for aircraft that employ thermoelectric generators. Moreover, the thermoelectric generator can be a solid state device. As a result, the thermoelectric generator does not require moving parts during operation, which can improve safety.

In some embodiments, the thermoelectric generator can be a silicon carbide (SiC) metal oxide semiconductor field effect transistor (MOSFET) thermoelectric generator. Use of a SiC MOSFET thermoelectric generator can require very little current to turn on, while delivering a much higher current to drive a electric load such as one or more aircraft systems. Compared to silicon, SiC can sustain much higher voltages (e.g., 10 times as much voltage) than silicon, carry much higher currents (e.g., 5 times as much current) than silicon, have a much higher thermal conductivity (e.g., about 3 times as much thermal conductivity) than silicon, and can operate up to 400° C. compared to 150° C. for silicon. As a result, the use of a SiC MOSFET thermoelectric device can provide significant advantages for high-temperature applications, such as powering engine control systems for aircraft engines. In addition, SiC has a higher energy band gap than silicon and is more robust (hardened) against disturbances such as heat, radiation or intense electromagnetic fields for both commercial and military aviation.

In one example implementation, the thermionic generator can receive heat from a heat source, such as solar heat or heat associated with bleed air or exhaust from an aircraft engine. The heat provided to the thermionic generator can cause a cathode (e.g., a hot electrode) of the thermionic generator to emit electrons over a potential energy barrier to an anode (e.g., a cooler electrode), producing electrical power for an aircraft electrical distribution system. Waste heat, (e.g., heat that is not converted to electrical energy by the thermionic generator) can be provided from the anode of the thermionic generator to the thermoelectric generator. In some embodiments, the thermoelectric generator can also receive heat from the heat source. The thermoelectric generator can generate electrical power from the waste heat using the Seebeck effect. The electrical power generated by the thermionic generator and the thermoelectric generator can be provided to an electrical distribution bus to power one or more aircraft systems, such as engine control systems, anti-icing systems, de-icing systems, and other aircraft systems.

In one embodiment, the combined thermionic generator and thermoelectric generator can be used to power an integrated ice protection system including an anti-icing system and a de-icing system. The aircraft anti-icing system can be configured to turn on before entering icing conditions and can be designed to prevent ice from forming on one or more portions of the aircraft. The anti-icing systems can include electrical heating elements embedded in aircraft structural components susceptible to icing to maintain a surface temperature above freezing level. The de-icing system can be configured to remove ice after it begins to accumulate on the aircraft. For example, the de-icing system can include electrical heating elements that can be switched on during exposure to icing conditions to remove ice from components of the aircraft.

The combined thermionic generator and thermoelectric generator according to example embodiments of the present disclosure can be particularly useful in unmanned aerial vehicles. For instance, the combined thermionic and thermoelectric generator can reduce a heat signature, increasing the stealth capability of the unmanned aerial vehicle. More particularly, the combined thermionic and thermoelectric generator can receive heat from the bleed air and/or exhaust from the propulsion engine, reducing infrared radiation emitted from these heat sources. In addition, the acoustic signature of the unmanned aerial vehicle can be reduced by generating electrical power using solid state devices through heat and solar energy. This reduces noise emanating from aircraft propulsion engines. In addition, the effective use of heat from solar energy can lead to increased flight range and flight times for the unmanned aerial vehicles.

FIG. 1 depicts an example power system 100 for an aircraft 50 according to example embodiments of the present disclosure. The aircraft 50 can be any suitable aircraft, such as an unmanned aerial vehicle, commercial aircraft, military aircraft, or other aircraft. The power system 100 can be used to provide electrical power to various aircraft systems on the aircraft 50. As shown, in FIG. 1, the power system 100 can include a heat source 110, a thermionic generator 120 and a thermoelectric generator 130. The thermionic generator 120 and the thermoelectric generator 130 can be configured to generate electrical power, such as DC electrical power, for distribution to one or more aircraft systems via an electrical distribution bus 140. The electrical distribution bus 140 can be, for instance, a DC bus.

The present disclosure is discussed with reference to a thermionic generator 120 and a thermoelectric generator 130 generating DC electrical power for purposes of illustration and discussion. In some embodiments, the thermionic generator 120 and/or the thermoelectric generator 130 can be coupled with a power converter (e.g., an inverter) configured to convert the DC power generated by the thermionic generator 120 and/or the thermoelectric generator 130 to AC power for powering one or more AC loads on the aircraft 50 via, for instance, an AC electrical bus.

The heat source 110 can be any source of heat suitable for operation of the thermionic generator 120 and can be located on or separated from the aircraft 50. In some embodiments, the heat source 110 can be bleed air and/or exhaust from a propulsion engine for the aircraft 50, such as a gas turbine engine. The thermionic generator 120 can be arranged in the aircraft 50 to receive heat from the bleed air and/or exhaust from the propulsion engine. For instance, in some embodiments, the bleed air can be associated with high temperature that is used to provide heat to the thermionic generator 120 as will be discussed in detail below.

In some embodiments, the heat source 110 can be solar heat captured by the thermionic generator 120. For instance, solar energy can be captured, concentrated (e.g., using one or more optical devices such as one or more lenses, reflectors, collimators, etc.), and provided to the thermionic generator 120. Other suitable heat sources can be used without deviating from the scope of the present disclosure.

The thermionic generator 120 can convert the heat provided to the thermionic generator 120 to electrical power by emitting electrons over a potential energy barrier from a cathode receiving the heat from the heat source 110 to an anode. The electrical power generated by the thermionic generator 120 can be provided to the electrical distribution bus 140.

Waste heat 122 from the thermionic generator 120 can be provided to the thermoelectric generator 130. The thermoelectric generator 130 can convert at least a portion of the waste heat 122 into electrical power based on the Seebeck effect. In some embodiments, the thermoelectric generator 130 can also receive heat 115 from the heat source 110. The electrical power generated by the thermoelectric generator 130 can be provided to the electrical distribution system 140.

The electrical distribution bus 140 can provide electrical power generated by the thermionic generator 120 and thermoelectric generator 130 to power one or more aircraft systems. For instance, the electrical distribution bus 140 can provide power to, for instance, an engine control system 142. The engine control system 142 can provide one or more control commands to various engine components (e.g., throttle, bleed valves, vanes, etc.) to control operation of the aircraft engine. The electrical distribution bus 140 can also provide power to, for instance, an ice protection system 144. The ice protection system 144 can include electrically heated resistive elements as part of anti-icing systems and de-icing systems that are used to reduce and/or prevent formation of ice on various components of the aircraft.

The electrical distribution bus 140 can provide power to other aircraft systems without deviating from the scope of the present disclosure. For instance, the electrical distribution bus 140 can provide power to an avionics system, display system, flight control system, digital control systems, throttle systems, inertial reference systems, flight instrument systems, auxiliary power systems, fuel monitoring system, engine vibration monitoring systems, communications systems, flap control systems, flight data acquisition systems, and other systems.

Figure 2:
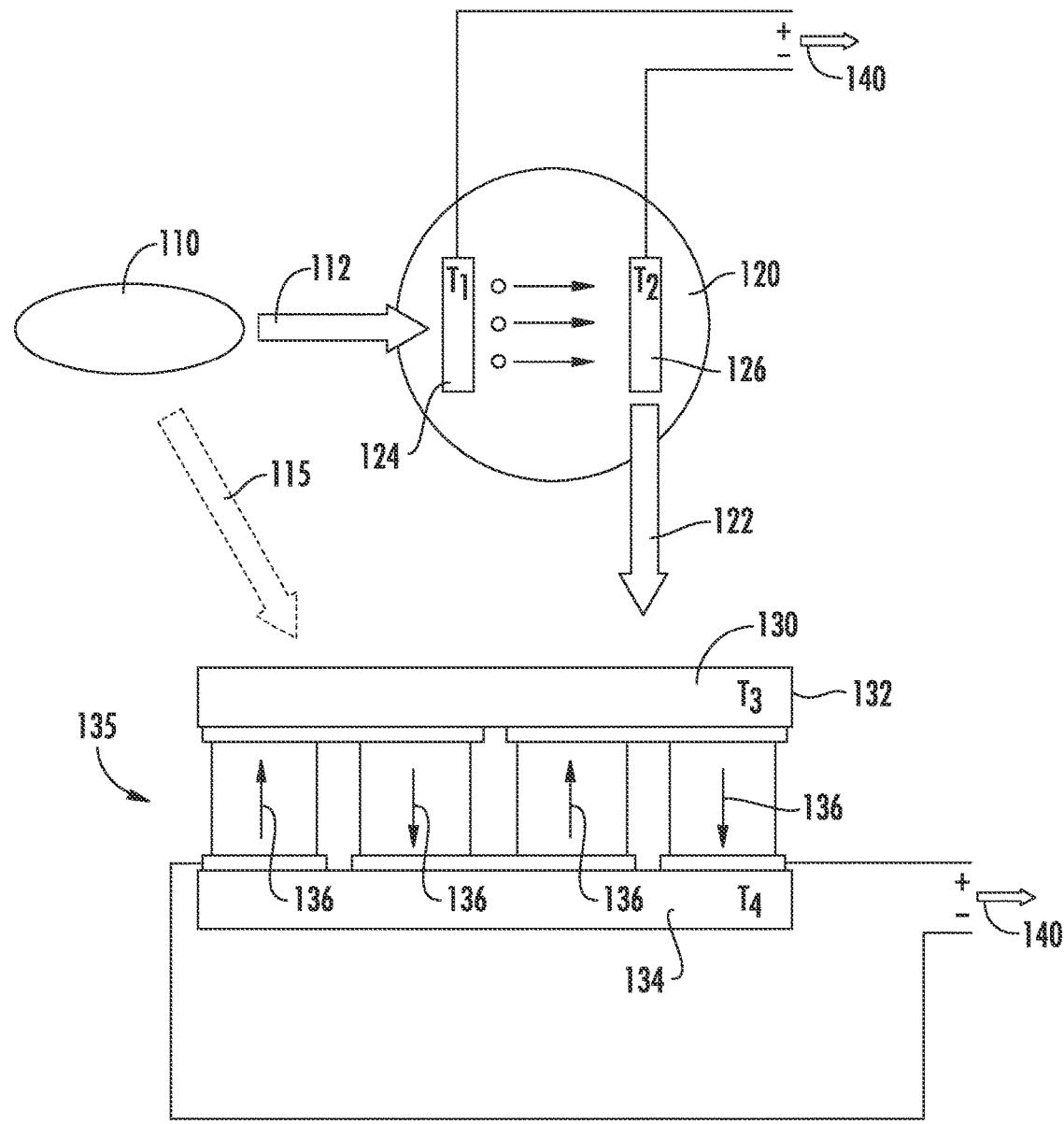
FIG. 2 depicts an example power generation system for an aircraft according to example embodiments of the present disclosure.

FIG. 2 depicts an overview of operation of the power generation system including a combined thermionic generator 120 and thermoelectric generator 130 according to example embodiments of the present disclosure. The thermionic generator includes a cathode (e.g., a hot electrode) 124 and an anode (e.g., a cold electrode) 126 separated by a gap. A vapor such as cesium vapor can be provided in the gap between the cathode 124 and the anode 126. Thermal energy in the form of heat 112 from heat source 110 is provided to the cathode 124 of the thermionic generator 120 causing the cathode 124 to be at a higher temperature T1 relative to a temperature T2 of the anode 126. This can cause the cathode 124 to emit electrons across a potential energy gap to anode 126. The resulting current can be used to provide DC power to the electrical distribution bus 140. For instance, the cathode 124 can be electrically coupled to a positive terminal of the electrical distribution bus 140 and the anode 126 can be electrically coupled to a negative terminal of the electrical distribution bus 140.

Waste heat 122 from the anode 126 of the thermionic generator 120 can be provided to the thermoelectric generator 130. In some embodiments, the thermoelectric generator 130 can additionally receive heat 115 from the heat source 110. The thermoelectric generator 130 can include a first conductor 132 and a second conductor 134. The first conductor 132 can have a higher temperature T3 relative to a temperature T4 of the second conductor 134 as a result of the waste heat 122 and/or the heat 115 from the heat source 110.

As illustrated in FIG. 2, the thermoelectric generator 130 can include a SiC MOSFET structure between the first conductor 132 and the second conductor 124. Portions 137 of the SiC MOSFET structure 135 can be n-doped semiconductor material and portions 138 of the SiC MOSFET structure 135 can be p-doped semiconductor material. When a current is provided to second conductor 134, electrons can travel through the SiC MOSFET structure 135 in the directions indicated by arrows 136 as a result of the temperature difference between the first conductor 132 and the second conductor 134. In this way, electrical power can be generated by the thermoelectric generator 130 and provided to the electrical distribution bus 140 as a result of the waste heat 122 applied from the anode of the thermionic generator 120 to the first conductor 132 of the thermoelectric generator 130.

Figure 3:
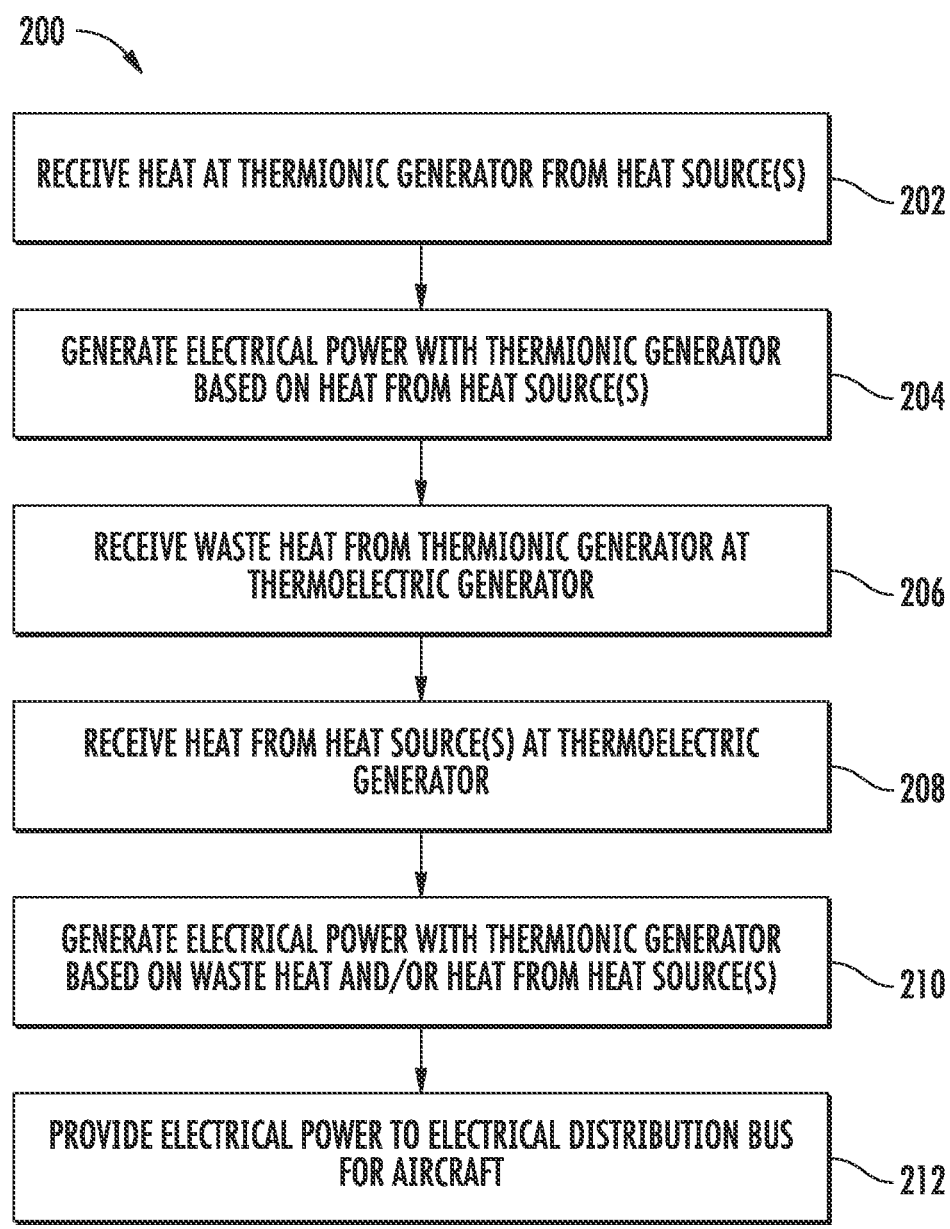
FIG. 3 depicts a flow diagram of an example method according to example embodiments of the present disclosure.

FIG. 3 depicts a flow diagram of an example method (200) for generating power for one or more aircraft systems according to example embodiments of the present disclosure. The method (200) can be implemented using the thermionic generator 120 and thermoelectric generator 130 discussed with reference to FIGS. 1 and 2. In addition, FIG. 3 depicts steps performed in a particular order for purposes of illustration and discussion. Those of ordinary skill in the art, using the disclosures provided herein, will understand that various steps of any of the methods described herein can be omitted, expanded, rearranged, modified, and/or adapted in various ways without deviating from the scope of the present disclosure.

At (202) the method includes receiving heat at a thermionic generator from one or more heat sources. For instance, heat 112 from heat source 110 can be received at cathode 124 of thermionic generator 120. At (204) of FIG. 3, electrical power is generated with the thermionic generator 120 based on the heat 112 received at the cathode 124 of the thermionic generator 120. More particularly, the heat 112 received at cathode 124 can cause the emission of electrodes from the cathode 124 to the anode 122 to generate electrical power.

At (206) of FIG. 3, the method includes receiving waste heat from the thermionic generator at the thermoelectric generator. For instance, waste heat 122 from the anode 126 of the thermionic generator 120 can be received at the thermoelectric generator 130 to increase the temperature of the first conductor 132 of the thermoelectric generator 130 relative to the temperature of the second conductor 134 of the thermoelectric generator 130. Heat can also optionally be received from the heat source at the thermoelectric generator as shown at (208) of FIG. 3. For instance, heat 115 can be received at the first conductor 132 of the thermoelectric generator 130.

At (210), the method can include generating electrical power with the thermoelectric generator. For instance, the thermoelectric generator 130 can generate electrical power as a result of a temperature difference between the first conductor 132 and the second conductor 134 caused by the application of waste heat 122 and/or heat 115 from heat source 110 to the thermoelectric generator 130.

At (212), the method can include providing the electrical power generated by the thermionic generator and/or the thermoelectric generator to an electrical distribution bus for power one or more aircraft systems. For instance, electrical power can be provided from the thermionic generator 120 and the thermoelectric generator 130 to electrical distribution bus 140 for powering aircraft systems, such as engine control system 142, ice protection system 144, and other systems.

Although specific features of various embodiments may be shown in some drawings and not in others, this is for convenience only. In accordance with the principles of the present disclosure, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A power generation system for an aircraft, the power generation system comprising:
a thermionic generator arranged to receive heat from at least one heat source, the thermionic generator configured to generate electrical power for one or more aircraft systems based at least in part on the heat received from the at least one heat source;

a thermoelectric generator arranged to receive waste heat from the thermionic generator;

wherein the thermoelectric generator comprises a silicon carbide metal oxide semiconductor field effect transistor and is configured to generate electrical power for one or more aircraft systems based at least in part on the waste heat received from the thermionic generator.

2. The power generation system of claim 1, wherein the thermionic generator and the thermoelectric generator are electrically coupled with an electrical distribution bus operable to supply power to the one or more aircraft systems.

3. The power generation system of claim 1, wherein the thermoelectric generator is arranged to receive waste heat from an anode of the thermionic generator.

4. The power generation system of claim 1, wherein the thermoelectric generator is arranged to receive heat from the at least one heat source.

5. The power generation system of claim 1, wherein the at least one heat source comprises bleed air or exhaust from an aircraft engine.

6. The power generation system of claim 1, wherein the at least one heat source comprises solar heat.

7. The power generation system of claim 1, wherein the one or more aircraft systems comprise a control system for controlling one or more components of the aircraft.

8. The power generation system of claim 1, wherein the one or more aircraft systems comprise an ice protection system for the aircraft.

9. A method of generating power for one or more aircraft systems, comprising:
   receiving heat at a thermionic generator comprising a silicon carbide metal oxide semiconductor field effect transistor from at least one heat source;
   generating electrical power with the thermionic generator for one or more aircraft systems based at least in part on the heat received from the at least one heat source;
   receiving waste heat from the thermionic generator at a thermoelectric generator; and
   generating electrical power with the thermoelectric generator for the one or more aircraft systems based at least in part on the waste heat received from the thermionic generator.

10. The method of claim 9, wherein receiving waste heat from the thermionic generator comprises receiving waste heat from an anode associated with the thermionic generator.

11. The method of claim 9, wherein the method comprises providing the electrical power generated by thermionic generator and the thermoelectric generator to an electrical distribution bus operable to supply power to the one or more aircraft systems.

12. The method of claim 9, wherein the method comprises receiving heat from the heat source at the at a thermoelectric generator and generating electrical power with the thermoelectric generator based at least in part on the heat received from the heat source.

13. An aircraft, the aircraft comprising:
   a heat source;
   an electrical distribution bus configured to distribute electrical power to one or more aircraft systems; and
   a thermionic generator arranged to receive heat from the heat source, the thermionic generator comprising a silicon carbide metal oxide semiconductor field effect transistor thermoelectric generator and configured to generate electrical power for the one or more aircraft systems based at least in part on the heat received from the at least one heat source;
   a thermoelectric generator arranged to receive waste heat from the thermionic generator;
   wherein the thermoelectric generator is configured to generate electrical power for one or more aircraft systems based at least in part on the waste heat received from the thermionic generator.

14. The aircraft of claim 13, wherein the heat source comprises bleed air or exhaust from a propulsion engine associated with the aircraft.

15. The aircraft of claim 13, wherein the heat source comprises solar heat.

16. The aircraft of claim 13, wherein the one or more aircraft systems comprise an engine control system or an ice protection system.

17. The aircraft of claim 13, wherein the aircraft is an unmanned aerial vehicle.

* * * * *